United States Patent [19]

Buck et al.

[11] Patent Number: 5,104,509
[45] Date of Patent: Apr. 14, 1992

[54] METHOD AND APPARATUS FOR PRODUCING LAYERS OF HARD CARBON MODIFICATIONS

[75] Inventors: Volker Buck, Velbert; Wolfgang Schlump; Jürgen Willbrand, both of Essen, all of Fed. Rep. of Germany

[73] Assignee: Fried. Krupp GmbH, Essen, Fed. Rep. of Germany

[21] Appl. No.: 619,408

[22] Filed: Nov. 29, 1990

[30] Foreign Application Priority Data

Dec. 14, 1989 [DE]  Fed. Rep. of Germany ....... 3941202

[51] Int. Cl.$^5$ .............................................. C23C 4/04
[52] U.S. Cl. ......................... 204/192.38; 204/298.41; 427/37
[58] Field of Search ...... 204/192.38, 298.41; 427/37

[56] References Cited

U.S. PATENT DOCUMENTS

| | | | |
|---|---|---|---|
| 3,931,542 | 1/1976 | Sheer et al. | 315/111.2 |
| 4,645,895 | 2/1987 | Boxman et al. | 219/76.13 |
| 4,851,254 | 7/1989 | Yamamoto et al. | 427/37 |
| 4,917,786 | 4/1990 | Ehrich | 204/192.38 |

FOREIGN PATENT DOCUMENTS

| | | |
|---|---|---|
| 0158972 | 10/1985 | European Pat. Off. |
| 0280315 | 8/1988 | European Pat. Off. ....... 204/192.38 |
| 0286306 | 10/1988 | European Pat. Off. ....... 204/192.38 |
| 906807 | 3/1954 | Fed. Rep. of Germany. |
| 3413891 | 1/1987 | Fed. Rep. of Germany ....... 204/192.38 |
| 3712205 | 10/1988 | Fed. Rep. of Germany ....... 204/192.38 |
| 61-288069 | 12/1986 | Japan ....... 427/37 |
| 63-282199 | 11/1988 | Japan. |

OTHER PUBLICATIONS

*Japanese Journal of Applied Physics*, vol. 27, No. 9, Sep. 1988, pp. L1600-L1602, "Rapid Growth of Diamond Films by Arc Discharge Plasma CVD", Fumio Akatsuka et al.

Primary Examiner—Aaron Weisstuch
Attorney, Agent, or Firm—Spencer, Frank & Schneider

[57] ABSTRACT

A method of producing layers of hard carbon modifications on a substrate includes disposing the substrate in a vacuum chamber in which an anode electrode and a cathode electrode are disposed and spaced from one another. The anode electrode is made of a carbon containing material and serves as a carbon source when a direct current is formed between the spaced electrodes. The two electrodes are energized, thereby forming a direct current arc in the vacuum between the spaced electrodes; and hydrogen is introduced directly into the region of the arc by flowing hydrogen through at least one of the two electrodes while simultaneously maintaining the arc between the electrodes to feed the arc with carbon from the anode thereby coating a surface of the substrate with a hard carbon layer.

24 Claims, 2 Drawing Sheets

FIG. 2a
FIG. 2b
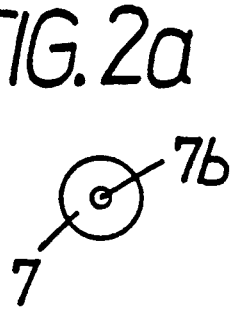
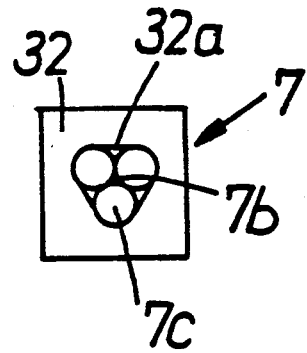
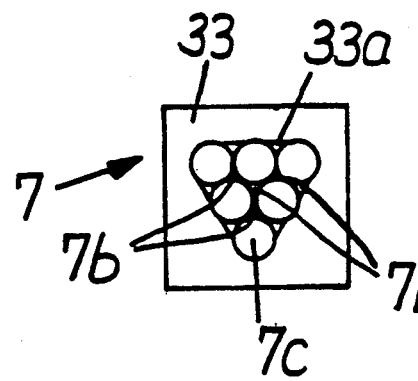
FIG. 2c
FIG. 3
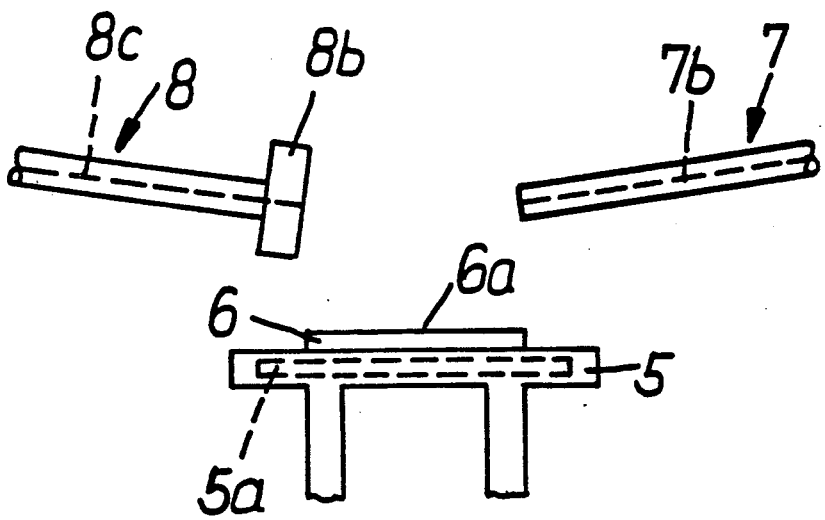

METHOD AND APPARATUS FOR PRODUCING LAYERS OF HARD CARBON MODIFICATIONS

CROSS-REFERENCE TO RELATED APPLICATION

The present disclosure relates to the subject matter disclosed in the Federal Republic of Germany Application No. P 39 41 202.4 filed on Dec. 14th, 1989, the entire specification of which is incorporated herein by reference.

FIELD OF THE INVENTION

The present invention relates to a method of producing layers of hard carbon modifications, particularly diamond films, by employing a carbon containing material and a direct current arc fired in a vacuum between two electrodes with the addition of hydrogen. The invention further relates to an apparatus suitable for implementing the method. Such an apparatus is equipped with a reaction chamber which includes a vacuum source accommodating a pair of electrodes for generating a direct current arc and a holder for a substrate to be coated. The apparatus further includes a gas inlet through which hydrogen can be supplied to the arc.

BACKGROUND OF THE INVENTION

A method and apparatus for rapid growth of diamond films is known as described in Akatsuka et al., *Japanese Journal of Applied Physics*, Volume 27, No. 9, Sept., 1988, pages L1600 to L1602. In this prior art method, the electrodes arranged in a vacuum in a reaction chamber serve exclusively to generate a vacuum discharge arc and the substrate to be coated is arranged on a holder disposed below the direct current arc fired between the electrodes A gas mixture composed of hydrogen and argon is introduced into the arc by way of a gas inlet disposed outside of the region of the electrodes. This gas mixture further includes ethanol which is used as a carbon source A drawback of this prior art method is that, with the use of gaseous hydrocarbons, carbon and hydrogen occur coupled to one another and do not vary completely independent of one another during the process; the same also applies for oxygen if ethanol is used. Moreover, the external supply of gas brings with it a larger percentage of neutral gases.

German Patent No. 3,413,891, which corresponds to U.S. Pat. No. 4,917,786, discloses a method and an apparatus for evaporating material in a vacuum chamber equipped with an anode which evaporates under the influence of a direct current arc. Both electrodes may be composed of graphite or may at least be coated with graphite. In a region facing the anode, the cathode has a considerably larger diameter than the anode.

In contrast to the method described in the Japanese periodical, this prior art vacuum discharge arc is maintained essentially by the fuel material produced by the evaporating anode components. Above the electrode pair, that is, outside of the region of the arc, there is provided a vapor-deposition chamber accommodating the substrate in which, if necessary, a reactive gas atmosphere is maintained to influence the vapor deposition process. However, this disclosed vacuum arc is unable to generate in sufficient quantities the atomic hydrogen and/or $H^+$ ions required for the production of diamond layers.

SUMMARY OF THE INVENTION

It is an object of the present invention to provide a method and an apparatus for implementing the method for producing diamond-like layers and primarily diamond films at layer formation rates on the order of one micrometer/minute.

The above object and other advantages of the present invention are achieved by a method including the steps of disposing a substrate to be coated in a vacuum, disposing an anode electrode and a cathode electrode in the vacuum, energizing the two electrodes which are spaced from one another to form a direct current arc therebetween, and introducing hydrogen directly into the region of the arc in the vacuum chamber by flowing hydrogen through at least one of the two electrodes while simultaneously maintaining the arc between the electrodes to feed the arc with carbon from the anode which acts as a carbon source so that particles leaving the arc bombard the substrate, coating a surface of the substrate with a hard carbon layer. Another feature according to the invention includes adjusting the spacing between the electrodes to maintain uniform process conditions.

The idea on which the invention is based is to supply the hydrogen required for the generation of the hard carbon modifications by means of at least one of the two electrodes directly into the region of the arc and to simultaneously feed the arc with carbon by way of the anode.

This proposed solution differs from the above-described prior art in that, the addition of hydrogen directly into the region of the arc provides sufficient amounts of atomic hydrogen and/or $H^+$ ions while carbon is fed from the consumed anode. Thus, the procedure is neither to feed the reaction substances exclusively by way of supplying gas into the region of the arc (Akatsuka et al., supra) nor to supply the reaction substances only from the evaporating anode material (German Patent No. 3,413,891).

In order to form the largest possible volume of atomic hydrogen and the largest possible number of $H^+$ ions, respectively, per unit time, the method according to the present invention can be employed in three ways: either the gas is supplied exclusively by way of one of the two electrodes, that is, the anode or the cathode; or, different percentages of the entire gas volume flow are supplied simultaneously through both electrodes. In order to set and maintain sufficiently uniform process conditions, the electrode spacing can be adjusted in a known manner during the process of forming the carbon layers on a substrate. The desired uniform coating process can be effected by making the adjustments as a function of the respective predetermined process parameters (for example, the electrode spacing), or independently thereof as the process progresses (that is, purely as a function of time).

According to the present invention, the layer formation rate can be increased, if necessary, by a process in which the arc is given a curvature in the direction toward the substrate to be coated. The substrate, in particular, may be composed of metal, ceramic or glass. Moreover, the arc should be adjusted so that it has a hydrogen dissociation rate of at least 50%.

Another advantageous feature of the method according to the invention is that the gas supply during the coating process may be dimensioned so that the volume flow of the total amount of hydrogen introduced lies between 20 and 2000 cm³/min. In particular, the introduction rate may be set so that the magnitude of the volume flow varies over time. During the coating process, the electrodes are supplied with energy preferably, at a voltage between 70 and 24 V, so that a current of a magnitude between 8 and 70 A flows through them. Maintenance and control of the arc can be simplified in that the electrodes can be charged with a pulsed direct voltage. This feature can be accomplished by superposing alternating voltage components on the direct voltage.

The coating process according to the present invention can be influenced further in that, before its entry into the arc, gases which increase the dissociation rate are mixed in with the hydrogen, such as, for example, argon. Moreover, the precipitation rate can be increased by admixing oxygen or oxygen compounds (for example $O_2$ or water vapor) into the hydrogen, as well.

During the coating process, the substrate should be heated to temperatures of no more than 1000° C. Moreover, an undesirably high substrate temperature can be avoided by bombarding the substrate surface to be coated with high energy particles, for example by employing an ion source.

The process according to the invention may also employ the step of bringing regions cooperating during the coating process to different electrical potentials. In particular, ions exiting the arc can be accelerated by a bias acting in the direction toward the substrate. This can be accomplished during the coating process by holding the substrate at a potential which is different from that of the anode.

The above-mentioned and other objects of the method can be implemented by an apparatus including: a reaction chamber equipped with a vacuum pressure source for producing a vacuum in the chamber; a pair of spaced electrodes, disposed in the reaction chamber where at least one of the two electrodes of the pair of electrodes is made of graphite and one of the two electrodes has a passage through which gases can flow; electrical supply means for energizing the electrodes to form a direct current arc between the electrodes in a vacuum; means for introducing hydrogen directly into the region of the arc by flowing hydrogen through the passage; and a holder for a substrate to be coated disposed in the chamber and spaced from the electrodes, wherein the electrode made of graphite is consumed under the influence of the arc between the two electrodes to feed the arc and hydrogen is introduced directly into the region of the arc so that carbon particles from the arc bombard the substrate to coat a surface of the substrate with a hard carbon layer.

Another aspect of the invention includes adjustment means attached to the electrodes so that their mutual spacing can be maintained by at least stepwise follow-up adjustments.

In order to ensure that primarily the anode is consumed which preferably is made of graphite, the cathode has a larger surface area than the anode in the region where it faces the anode. Preferably, the surface area of the cathode is at least three times larger than that of the anode.

According to the present invention, the process sequence and the process results can be influenced in a favorable manner in that at least the anode is made of a high density graphite and is configured so that its gas discharge during the coating process is low. Preferably, the anode and/or the cathode are heated before the coating process.

In an advantageous embodiment of the apparatus, at least one of the two electrodes is equipped with at least one gas channel and can be connected to a gas supply by way of this gas channel.

When it becomes impossible for reasons of dimensions or manufacturing technology to equip the electrodes (particularly the smaller dimensioned anode) with a continuous gas channel, another modification envisioned by the invention provides that at least one of the two electrodes may be composed of several rods forming a packet between which extends the at least one gas channel. For example, an electrode equipped with a gas channel in the center can be produced in a simple manner by means of a packet of three rods each having a circular cross section.

By assembling an electrode from a larger number of rods, further gas channels can be produced between them at little expense with the result of a broader distribution of the gas supply. The advantage of such a configuration is that the gas channels of the respective electrode can be charged to different degrees and/or with different gases. For example, part of the gas channels may serve to supply hydrogen into the arc while, for example, argon or oxygen, respectively, is supplied through the other gas channels, possibly only temporarily.

According to another aspect of the invention, the coating process can be favorably influenced in that the electrodes are arranged at a slope toward one another in the direction toward the substrate. With such an arrangement, the mutually facing regions of the electrodes enclose an angle, when viewed from the substrate, of more than 180°.

Any possible disadvantage in heating the substrate (in the normal case to temperatures of at least 400° C.) can be reduced in that the reaction chamber of the invention can be additionally equipped with a particle source for charging the substrate surface with high energy particles.

In another advantageous feature of the apparatus, the gas supply may be connected to a mixer through which additional gases for influencing the coating process can be mixed in with the hydrogen.

BRIEF DESCRIPTION OF THE DRAWINGS

The invention will now be described in greater detail with reference to the drawing figures in which:

FIG. 2a is a front view of an embodiment of an electrode according to the present invention, which includes a gas channel in the form of a longitudinal bore;

FIGS. 2b and 2c are frontal views of two additional embodiments of an electrode composed of three and six rods, respectively, forming one and four gas channels, respectively;

FIG. 3 is a partial view of the arrangement of FIG. 1, with the electrodes being sloped toward one another in the direction toward the substrate.

DESCRIPTION OF THE PREFERRED EMBODIMENTS

Figure 1:
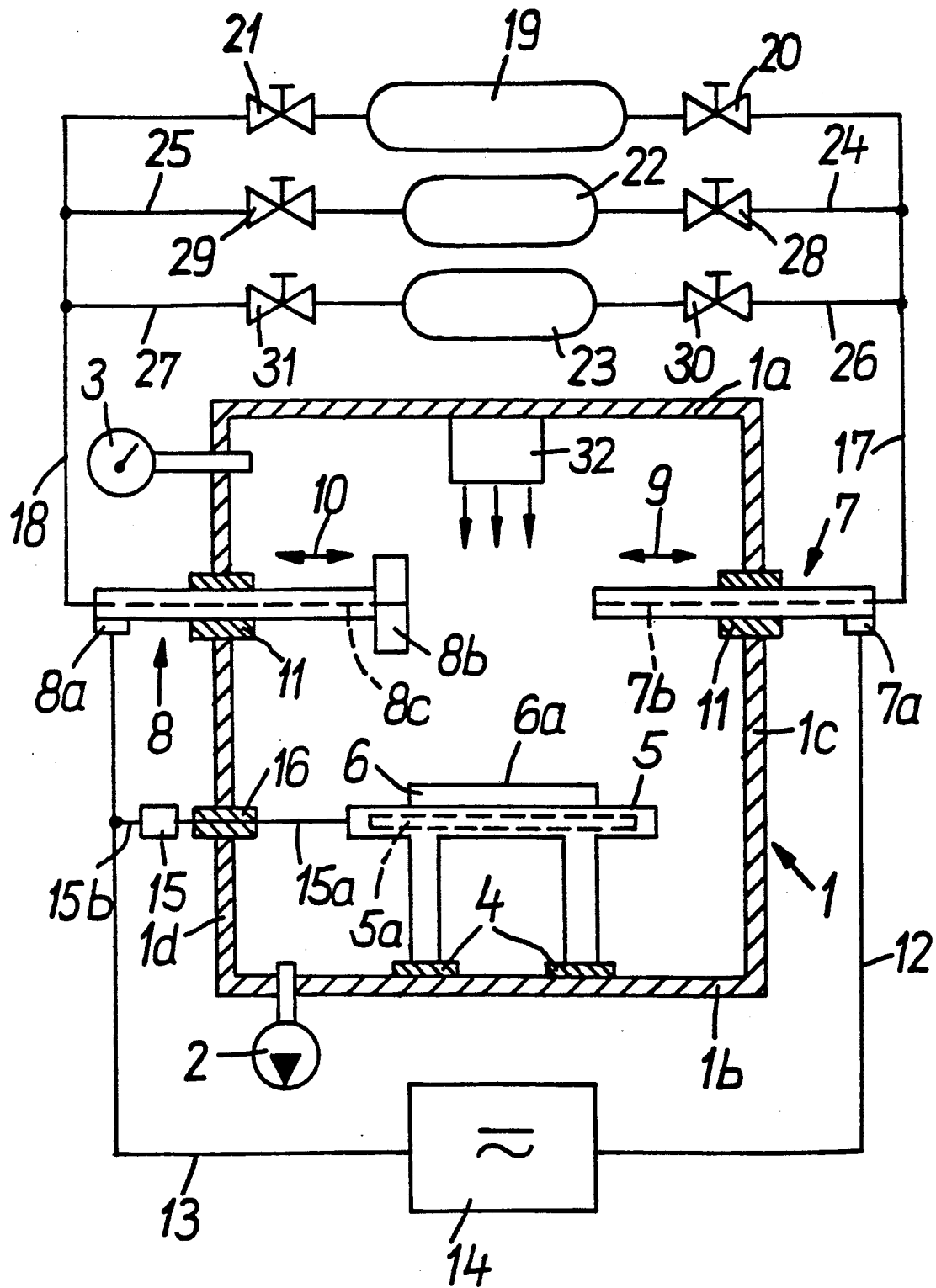
FIG. 1 is a schematic illustration of an apparatus for producing layers of hard carbon modifications according to the present invention.

Referring to FIG. 1, one of the major components of the apparatus for producing layers of hard carbon modifications is a reaction chamber 1 in which a sufficient subatmospheric pressure can be produced by means of a vacuum pump 2. The vacuum existing in the reaction chamber is monitored by means of a vacuum gauge 3 which is held in the vicinity of a head or top plate 1a.

On a base plate 1b of the reaction chamber, a table-shaped receptacle 5 is fastened through the intermediary of electrical insulation 4, and a substrate 6 to be coated rests on this receptacle. The receptacle is equipped with a heating unit 5a by means of which the substrate temperature can be influenced and regulated, respectively.

An anode 7 and a cathode 8 project into the reaction chamber so that they face one another in the same plane, and are displaceable in a straight line in the direction of the double arrows 9 and 10, respectively, by way of an adjustment drive (not shown). The supports of these electrodes 7 and 8 are composed of insulating sleeves 11 which in turn are fastened to side walls 1c and 1d. The adjustment drive in conjunction with the insulating sleeves 11 maintain uniform process conditions during a coating process by adjusting the spacing between electrodes 7 and 8 in a stepwise manner.

Outside of reaction chamber 1, electrodes 7 and 8 are connected, by way of connecting clamps 7a and 8a, respectively, and supply wires 12 and 13, respectively, to an energy supply unit 14 which charges the two electrodes with a pulsed direct voltage to produce a vacuum discharge arc therebetween during a coating process. During the coating process, electrodes 7 and 8 are charged with a voltage between 70 and 24 V so that a corresponding current of a magnitude between 8 and b 70 A flows through electrodes 7 and 8. The electrodes can be equipped with a heating unit so that at least one of the electrodes can be heated before the substrate is to be coated.

The end section of cathode 8 facing anode 7 is configured with a disc-shaped widened portion 8b. Its surface area is more than three times larger than the diameter of the merely rod-shaped anode 7.

During the coating process, receptacle 5 may be held, by way of a supply wire 15a which is in communication with wire 13, at a potential that is different from that of anode 7 to provide a biasing potential so that particles leaving the arc are accelerated toward the substrate. Wire 15a is insulated from side wall 1d by means of an insulating sleeve 16 which serves as a passage and is supplied with power from a power source 15. Power source 15 in turn is connected to wire 13 by way of a supply wire 15b.

Each electrode 7, 8 is provided with a gas channel 7b and 8c, respectively, which passes through the respective electrode and is connected by way of a gas conduit 17 and 18, respectively, to a gas supply. The latter includes a reservoir 19 filled with hydrogen which is in communication with gas conduit 17 and 18, respectively, through the intermediary of check valves 20 and 21, respectively.

The gas supply further includes a reservoir 22 filled with argon (Ar) and a reservoir 23 filled with oxygen (O$_2$). These reservoirs are connected by way of conduits 24, 25 and 26, 27, respectively, each including check valves 28, 29, and 30, 31, respectively, to gas conduits 17 and 18, respectively.

By actuating check valves 20 and 21, the volume flow of hydrogen supplied during the coating process through gas channels 7b and 8c can be apportioned in such a manner that the formation rate for atomic hydrogen and/or H$^+$ ions in the arc between electrodes 7 and 8 takes on the highest possible value. The arc can be adjusted to produce a hydrogen dissociation rate of 50%. If necessary, the process sequence can be influenced by opening check valves 28, 29 and 30, 31, respectively, so that argon is mixed into the hydrogen before it enters into the arc so as to increase the dissociation rate or oxygen is added to increase the precipitation rate. Since anode 7 is to be consumed under the influence of an arc (not shown), the anode is composed of high density graphite which discharges only a small amount of gas during the coating process.

The method according to the invention is implemented in that, once at least one of check valves 20 and 21 has been opened, the hydrogen stored in reservoir 19 is introduced directly into the arc through the associated gas conduits 17 and 18, respectively, and the subsequent gas channels 7b and 8c, respectively, and the arc is fed by the anode 7 acting as carbon source, with the spacing between electrodes 7 and 8 being adjusted. Before the firing of an arc, the interior of the reaction chamber is evacuated by turning on vacuum pump 2 to produce a vacuum, and substrate 6 is heated by means of a heating unit 5a to a temperature above 400° C., preferably no more than 1000° C. According to another feature of the method, an undesirable high substrate temperature can be avoided by bombarding the substrate surface to be coated with high energy particles.

Under the influence of the negative potential relative to anode 7 which is generated via supply wire 15, the ions leaving the arc once it has been fired are accelerated by the biasing potential in the direction toward the surface 6a of the substrate to be coated and are there precipitated as a hard carbon modification, preferably in the form of a diamond layer. The layer formation rate can be increased, if necessary by forming the arc with a curvature in a direction toward the substrate to be coated. The reaction chamber 1 can be further equipped with a particle source 32 by means of which a surface of the substrate can be charged with high energy particles.

In addition, the introduction rate of the volume flow of gas may vary over time. A preferred hydrogen rate of volume flow is between 20 and 2000 cm$^3$/min. In order to realize a layer formation rate on the order of one micrometer per minute, the total hydrogen volume flow introduced into reactor chamber 1 through one electrode or both electrodes, respectively, is more than 100 cm$^3$/min.

In its simplest embodiment, each electrode 7 can be equipped with a gas channel 7b in the form of a longitudinal bore as shown in FIG. 2a. Since the formation of such a gas channel depends on the electrode diameter and/or the ability to drill a bore in the chosen electrode material, there are some electrodes in which a longitudinal bore or passage can not be produced or only at considerable expense. Therefore, it may be better to form anode 7 and possibly also the cathode 8 of several rods forming a packet as shown in an exemplary manner in FIGS. 2b and 2c.

As shown in FIG. 2b, if three rods 7c are employed which are supported on one another by means of a clamping plate 32 or several successive clamping plates, an electrode results which has a gas channel 7b extending in the middle between rods 7c. The at least one clamping plate 32 is then provided with an opening 32a which is adapted to the exterior outline of rods 7c.

In the embodiment according to FIG. 2c, an exemplarily anode 7 is created in that, under the influence of at least one clamping plate 33 equipped with an adapted opening 33a, six rods 7c are supported against one another. These rods together enclose four gas channels 7b. The advantage realized by this embodiment is that the respective electrode has a larger number of gas channels which, if necessary, can be charged independently of one another with different gases (hydrogen and Ar and/or $O_2$). Of course, the cathode may be composed correspondingly of several rods forming a packet. But the condition must be met that its region facing the anode has a considerably larger surface area than the anode.

The coating process taking place when an arc is maintained between electrodes 7 and 8 can be influenced in a positive manner if the electrodes are not parallel with one another as shown in FIG. 1, but are sloped toward one another in the direction toward substrate 6 and the surface 6a to be coated.

Such an embodiment in which electrodes 7 and 8 enclose an angle greater than 180°, when viewed from substrate 6, is indicated in FIG. 3. As a result of the sloped position of electrodes 7 and 8, the formed arc ensures that the particles leave the arc to a greater degree in the direction toward the substrate surface 6a.

The advantage realized with the present invention is, in particular, that, with improved control over the process, even diamond layers can be produced at a high layer formation rate.

It will be understood that the above description of the present invention is susceptible to various modifications, changes and adaptations, and the same are intended to be comprehended within the meaning and range of equivalents of the appended claims.

What is claimed is:

1. A method of producing layers of hard carbon modifications on a substrate, comprising the steps of:
    disposing the substrate in a vacuum chamber;
    disposing an anode electrode and a cathode electrode in the vacuum chamber and spaced apart form one another generally in a longitudinal direction of the electrodes, wherein the anode electrode is made of a carbon containing material to serve as a carbon source when a direct current arc is formed between said electrodes;
    energizing the two electrodes to form a direct current arc in the vacuum between the electrodes; and
    introducing hydrogen directly into the region of the arc in the vacuum chamber by flowing hydrogen through at least one of the two electrodes while simultaneously maintaining the arc between the electrodes to feed the arc with carbon from the anode wherein carbon particles from the arc bombard the substrate to coat a surface of the substrate with a hard carbon layer.

2. The method of claim 1, further comprising adjusting the spacing of the electrodes to maintain uniform process conditions.

3. A method as defined in claim 1, further comprising forming the arc with a curvature in a direction toward the substrate to be coated.

4. A method as defined in claim 1, further comprising adjusting the arc to produce a hydrogen dissociation rate of at least 50%.

5. A method as defined in claim 1, wherein said introducing step includes supplying a volume flow of hydrogen between 20 and 2000 $cm^3$/min.

6. A method as defined in claim 1, wherein said energizing step comprises charging the electrodes with a voltage between 70 and 24 V so that a corresponding current of a magnitude between 8 and 70 A flows through the electrodes.

7. A method as defined in claim 1, wherein said energizing step includes charging the electrodes with a pulsed direct voltage.

8. A method as defined in claim 1, further comprising mixing gases with the hydrogen which increase the dissociation rate of the hydrogen before said introducing step.

9. A method as defined in claim 8, wherein the mixing gases of said mixing step comprise oxygen or oxygen compounds.

10. A method as defined in claim 1, further comprising heating the substrate to temperatures no more than 1000° C.

11. A method as defined in claim 1, further comprising bombarding the surface of the substrate to be coated with high energy particles.

12. A method as defined in claim 1, further comprising providing a biasing potential so that particles leaving the arc are accelerated by the biasing potential in the direction toward the substrate.

13. A method as defined in claim 12, wherein said biasing step includes holding the substrate at an electrical potential which is different from that of the anode.

14. An apparatus for generating layers of hard carbon modifications on a substrate, comprising:
    a reaction chamber equipped with a vacuum pressure source for producing a vacuum in said chamber;
    a pair of electrodes disposed in said reaction chamber and spaced apart from one another generally in a longitudinal direction of the two electrodes, at least one of the two electrodes of said pair of electrodes being made of graphite and at least one of the two electrodes having a passage through which gases can flow; electrical supply means for energizing said electrodes to form a direct current arc between said electrodes in a vacuum;
    means for introducing hydrogen directly into the region of the arc by flowing hydrogen through said passage; and
    a holder for a substrate to be coated disposed in said chamber and spaced from said electrodes, wherein said at least one electrode made of graphite is consumed under the influence of the arc between said two electrodes to feed the arc and hydrogen is introduced directly into the region of the arc so that carbon particles from the arc bombard the substrate to coat a surface of the substrate with a hard carbon layer.

15. An apparatus as defined in claim 14, further comprising adjustment means attached to said electrodes for maintaining the spacing between said two electrodes in a stepwise manner.

16. An apparatus as defined in claim 14, wherein said pair of electrodes includes a cathode and an anode, and in the region facing said anode, said cathode has a surface area which is at least three times larger than the surface area of said anode.

17. An apparatus as defined in claim 14, wherein said pair of electrodes includes an anode and a cathode, and at least said anode is composed of high density graphite and is configured so that it discharges only a small amount of gas during a coating process.

18. An apparatus as defined in claim 14, further comprising heating means and wherein at least one of said two electrodes is heated before the substrate is to be coated.

19. An apparatus as defined in claim 14, wherein said hydrogen introducing means includes a gas supply and said at least one electrode having said passage is equipped with at least one gas channel and can be connected to the gas supply by way of this gas channel.

20. An apparatus as defined in claim 19, wherein at least one of the two electrodes includes a plurality of rods forming a packet and the gas channel extends between said plurality of rods.

21. An apparatus as defined in claim 20, wherein the packet comprises three rods.

22. An apparatus as defined in claim 19, further comprising a gas mixing unit and wherein said gas supply can be connected to said mixing unit through which gases which additionally influence the coating of the substrate can be admixed.

23. An apparatus as defined in claim 14, wherein said electrodes are sloped toward one another in the direction toward the substrate.

24. An apparatus as defined in claim 14, wherein said reaction chamber is further equipped with a particle source by means of which a surface of the substrate can be charged with high energy particles.

* * * * *